(12) United States Patent
Chen (10) Patent No.: US 10,492,298 B1
(45) Date of Patent: Nov. 26, 2019

(54) ASSEMBLY OF PRINTED CIRCUIT BOARD AND CARD EDGE CONNECTOR FOR MEMORY MODULE CARD

(71) Applicant: Sung-Yu Chen, Hsinchu (TW)

(72) Inventor: Sung-Yu Chen, Hsinchu (TW)

(73) Assignee: Sung-Yu Chen, Hsinchu (TW)

( * ) Notice: Subject to any disclaimer, the term of this patent is extended or adjusted under 35 U.S.C. 154(b) by 0 days.

(21) Appl. No.: 16/407,185

(22) Filed: May 9, 2019

(30) Foreign Application Priority Data

May 9, 2018 (CN) .......................... 2018 1 0439523

(51) Int. Cl.
*H01R 12/72* (2011.01)
*H05K 1/11* (2006.01)
*H01L 23/00* (2006.01)
*H05K 5/02* (2006.01)
*H01R 12/73* (2011.01)

(52) U.S. Cl.
CPC .............. *H05K 1/116* (2013.01); *H01L 24/31* (2013.01); *H01R 12/721* (2013.01); *H01R 12/737* (2013.01); *H05K 5/0217* (2013.01)

(58) Field of Classification Search
CPC .................. H05K 1/116; H05K 1/141; H05K 2201/10295; H05K 2201/10303; H05K 5/0069; H05K 3/3405; H01R 12/721; H01R 12/737; H01R 13/665; H01R 13/6616; H01R 43/26; H01R 12/7023; H01R 12/7058; H01R 12/585; H01R 13/6461; H01R 43/20; Y10T 29/49218; Y10T 29/49208; Y10T 29/49222
See application file for complete search history.

(56) References Cited

U.S. PATENT DOCUMENTS

| | | | | |
|---|---|---|---|---|
| 5,051,099 A | * | 9/1991 | Pickles | H01R 12/721 439/108 |
| 5,090,116 A | * | 2/1992 | Henschen | B23K 3/0475 29/827 |
| 5,924,876 A | * | 7/1999 | Beamenderfer | H01R 12/7005 439/79 |
| 6,017,246 A | * | 1/2000 | Hisazumi | H01R 12/718 439/377 |
| 6,095,821 A | * | 8/2000 | Panella | H01R 12/721 439/60 |
| 9,545,004 B2 | * | 1/2017 | Minich | H05K 1/116 |

(Continued)

*Primary Examiner* — Steven T Sawyer
(74) *Attorney, Agent, or Firm* — Li & Cai Intellectual Property Office (57) ABSTRACT

An assembly of a printed circuit board and a card edge connector for a memory module card includes a card edge connector and a printed circuit board. The card edge connector includes an insulated housing, and a plurality of terminals. The terminals are received in terminal slots formed in the insulated housing, and divided into a plurality of upper and lower terminal rows, respectively received in the terminal slots at two sides of the longitudinal direction. Each terminal row includes a first terminal, a second terminal, and a third terminal. The printed circuit board has plated through holes and grounding via holes. The plated through holes are respectively located at two sides of an orthographic projection of the elongated slot of the card edge connector, and arranged into a plurality of upper rows and a plurality of lower rows at two sides of the printed circuit board.

11 Claims, 10 Drawing Sheets

(56) References Cited

U.S. PATENT DOCUMENTS

| | | | |
|---|---|---|---|
| 9,583,881 B2* | 2/2017 | Yan .................... | H01R 13/6471 |
| 2012/0252232 A1* | 10/2012 | Buck .................... | H01R 12/585 |
| | | | 439/55 |
| 2019/0190212 A1* | 6/2019 | Fang ................... | H01R 13/6594 |
| 2019/0214755 A1* | 7/2019 | Manickam ........... | H01R 12/721 |

* cited by examiner

ASSEMBLY OF PRINTED CIRCUIT BOARD AND CARD EDGE CONNECTOR FOR MEMORY MODULE CARD

CROSS-REFERENCE TO RELATED PATENT APPLICATION

This application claims the benefit of priority to China Patent Application No. 201810439523.4, filed on May 9, 2018, in the People's Republic of China. The entire content of the above-identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an assembly of printed circuit board and card edge connector for a memory module card, and more particularly to a DIMM (Dual In-line Memory Module) card edge connector for receiving a memory module card therein, and a printed circuit board for the card edge connector mounted thereon.

BACKGROUND OF THE DISCLOSURE

Most computer servers, laptop computers, notebook computers, tablet PCs and mobile phones are applied with various Dual In-line Memory Module (DIMM), and advancements in relevant technology have been swift. To avoid shortening the life cycle of the end products with the above-mentioned DIMM applications and a drastic change of relevant designing philosophies, associations responsible for establishing relevant standards usually opt to maintain existing specifications of physical dimensions in order to promote accelerated progress in the industry. However, such philosophy for innovation causes the development of related components to be difficult. For example, the single channel transmission frequency of a conventional fourth generation of DIMM memory module card has reached 25.6 GB/s, but the single channel transmission frequency of a next generation of DIMM memory module card is estimated to reach 51.2 GB/s with the same physical dimensions.

A conventional DIMM card edge connector cannot achieve a corresponding high-frequency performance in a next generation of the double data rate (DDR) transferring data memory module card while maintaining the same physical dimensions. Therefore, relevant development has trended toward surface mounting technology (SMT) connectors. However, with the large physical dimensions of the original structure, coplanarity would be an issue that is hard to break through, making the mass production thereof difficult.

SUMMARY OF THE DISCLOSURE

In response to the above-referenced technical inadequacies, the present disclosure provides an assembly of a printed circuit board (PCB) and a card edge connector for a memory module card. Under the premise of the same physical dimensions and that contacting portions of terminals have the same pitches, the pitch between the soldering portions of high-frequency signal terminals is larger than the pitch between the soldering portion of a high-frequency signal terminal and the soldering portion of a ground terminal. Thus, the near end cross-talk of high-frequency signals is lower than −25 dB under a transmission frequency within a range of 0 GHz to 5 GHz, and the single channel transmission bandwidth can reach 51.2 GB/s, so as to provide a better shielding effect for the high-frequency signal transmission and enhance the capacity of channel transmission.

In one aspect, the present disclosure provides an assembly of a PCB and a card edge connector for a memory module card, which includes a card edge connector and a PCB. The card edge connector includes an insulated housing and a plurality of terminals. The insulated housing has an elongated slot formed along a longitudinal direction thereof, and a key portion. The key portion is located in the elongated slot and divides the elongated slot into a first slot and a second slot. The insulated housing is formed with a plurality of terminal slots. The terminal slots are respectively located at two sides of the elongated slot and perpendicular to the longitudinal direction. The terminals are received in the terminal slots correspondingly. The terminals are divided into an upper group and a lower group. The upper group includes a plurality of upper terminal rows, and the lower group includes a plurality of lower terminal rows. The upper terminal rows are received in the terminal slots arranged at one side of the longitudinal direction, and the lower terminal rows are received in the terminal slots arranged at the other side of the longitudinal direction. Each of the upper terminal rows and each of the lower terminal rows respectively include a first terminal, a second terminal, and a third terminal Each terminal has a contacting portion, a soldering portion, and a linking portion. The linking portion interconnects the contacting portion and the soldering portion. In the upper terminal row and the lower terminal row, the linking portion of the first terminal is bent toward a direction perpendicular to the longitudinal direction away from the elongated slot, a bending direction of the linking portion of the third terminal is opposite to a bending direction of the first terminal, the linking portion of the second terminal is configured to be located closely between the linking portion of the first terminal and the linking portion of the third terminal. A distance between the contacting portion of the first terminal and the contacting portion of the second terminal is equal to a distance between the contacting portion of the second terminal and the contacting portion of the third terminal, and said distance is larger than a distance between the soldering portion of the first terminal and the soldering portion of the second terminal, and is larger than a distance between the soldering portion of the second terminal and the soldering portion of the third terminal. The first terminal of the upper terminal row is disposed in the terminal slot at one side of the longitudinal direction of the insulated housing, and is configured to structurally mirror the first terminal of the lower terminal row disposed in the terminal slot at the other side of the longitudinal direction of the insulated housing. The third terminal of the upper terminal row is configured to structurally mirror the third terminal of the lower terminal row. In any one of the upper terminal rows, a distance between the soldering portion of the first terminal and the soldering portion of the third terminal from an adjacent one of the upper terminal rows is larger than a distance between any two of the soldering portions of the terminals in the same terminal tow; in any one of the lower terminal rows, a distance between the soldering portion of the first terminal and the soldering portion of the third terminal from an adjacent one of the lower terminal rows is larger than a distance between any two of the soldering portions of the terminals in the same terminal row. The printed circuit board is formed with a plurality of plated through holes and a plurality of grounding via holes. The plated through holes are respectively located at two sides of an orthographic projection of the elongated slot of the card edge connector. The plated through holes are arranged into a plurality of upper rows on one of the sides and a plurality of lower rows on the other side oblique to the longitudinal direction of the printed circuit board. The plated through holes include a plurality of ground signal holes and a plurality of high-frequency signal holes, which are configured as follow. The ground signal hole of a first upper row is correspondingly matched with the second terminal of the upper terminal row. The high-frequency signal hole of the first upper row close to the ground signal hole of the first upper row is correspondingly matched with the third terminal of the upper terminal row. The high-frequency signal hole of a second upper row is correspondingly matched with the second terminal of the upper terminal row. The ground signal hole of the second upper row is correspondingly matched with the third terminal of the upper terminal row, and is close to the high-frequency signal hole of the second upper row. The ground signal hole of a first lower row is correspondingly matched with the first terminal of the lower terminal row. The high-frequency signal hole of a first lower row, which is close to the ground signal hole of the first lower row, is correspondingly matched with the second terminal of the lower terminal row. The ground signal hole of the first lower row, which is close to the high-frequency signal hole of the first lower row, is correspondingly matched with the third terminal of the lower terminal row. The high-frequency signal hole of a second lower row is correspondingly matched with the first terminal of the lower terminal row. The ground signal hole of the second lower row, which is close to the high-frequency signal hole of the second lower row, is correspondingly matched with the second terminal of the lower terminal row. The high-frequency signal hole of the first upper row and the second upper row of the high-frequency signal hole are separated by one of the grounding via holes. The high-frequency signal hole of the first lower row and the high-frequency signal hole of the second lower row are separated by one of the grounding via holes.

Therefore, the present disclosure has advantages and functions as follows. For the card edge connector of the present disclosure, since the soldering portions of the terminals in the same terminal row extend toward the second terminal and are close to each other, a better shielding effect for the high-frequency signal transmission can be provided when the second terminal is used to transmit ground signals. The high-frequency signal holes are isolated by ground traces or the grounding via holes, such that they can provide a good shielding effect for avoiding cross-talk interference. In addition, the card edge connector can be configured with more terminals for high-frequency signals for matching with the DDR memory module card of the next generation.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
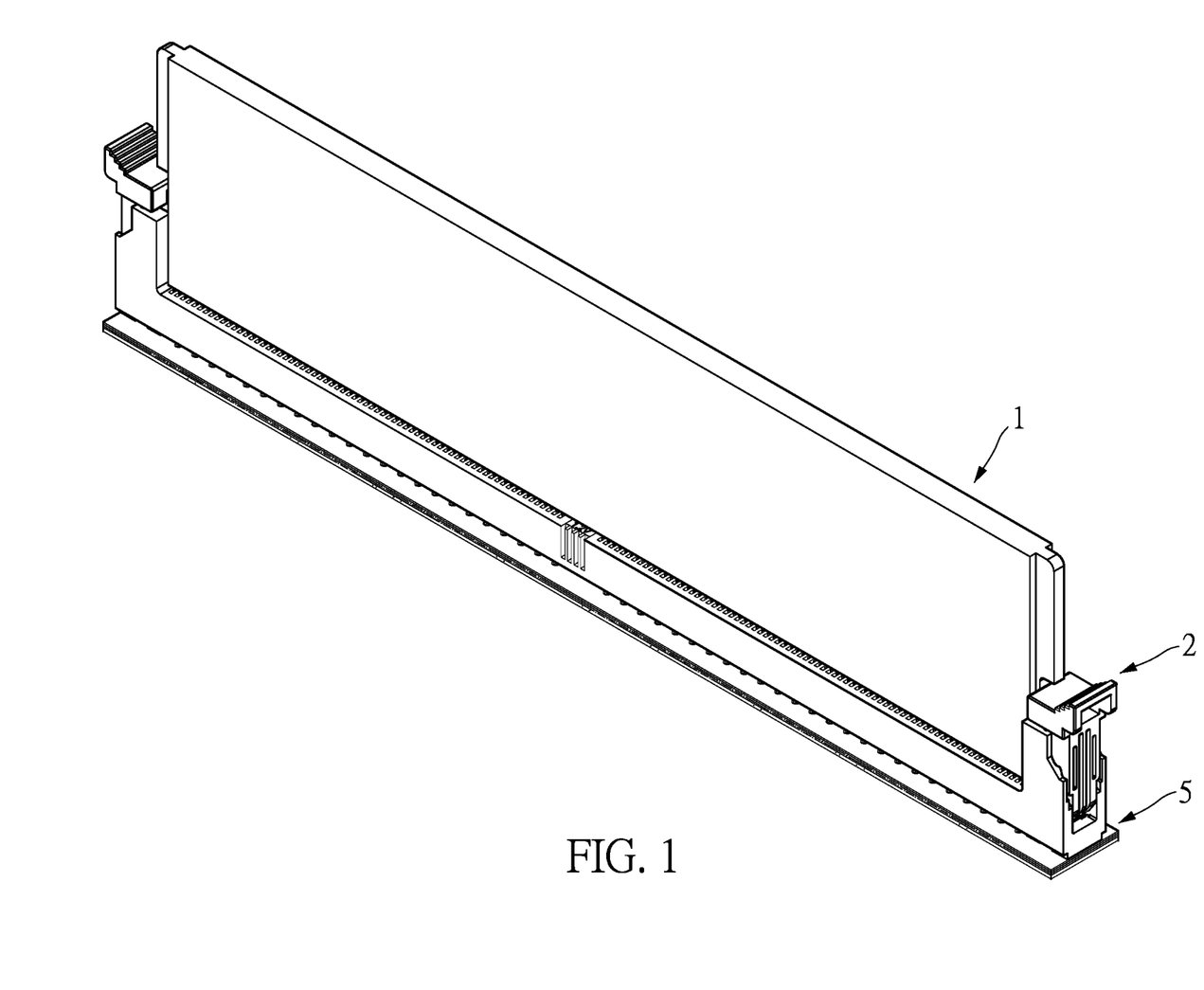
FIG. 1 is a perspective view of a card edge connector, a printed circuit board and a memory module card of the present disclosure.
Figure 2A:
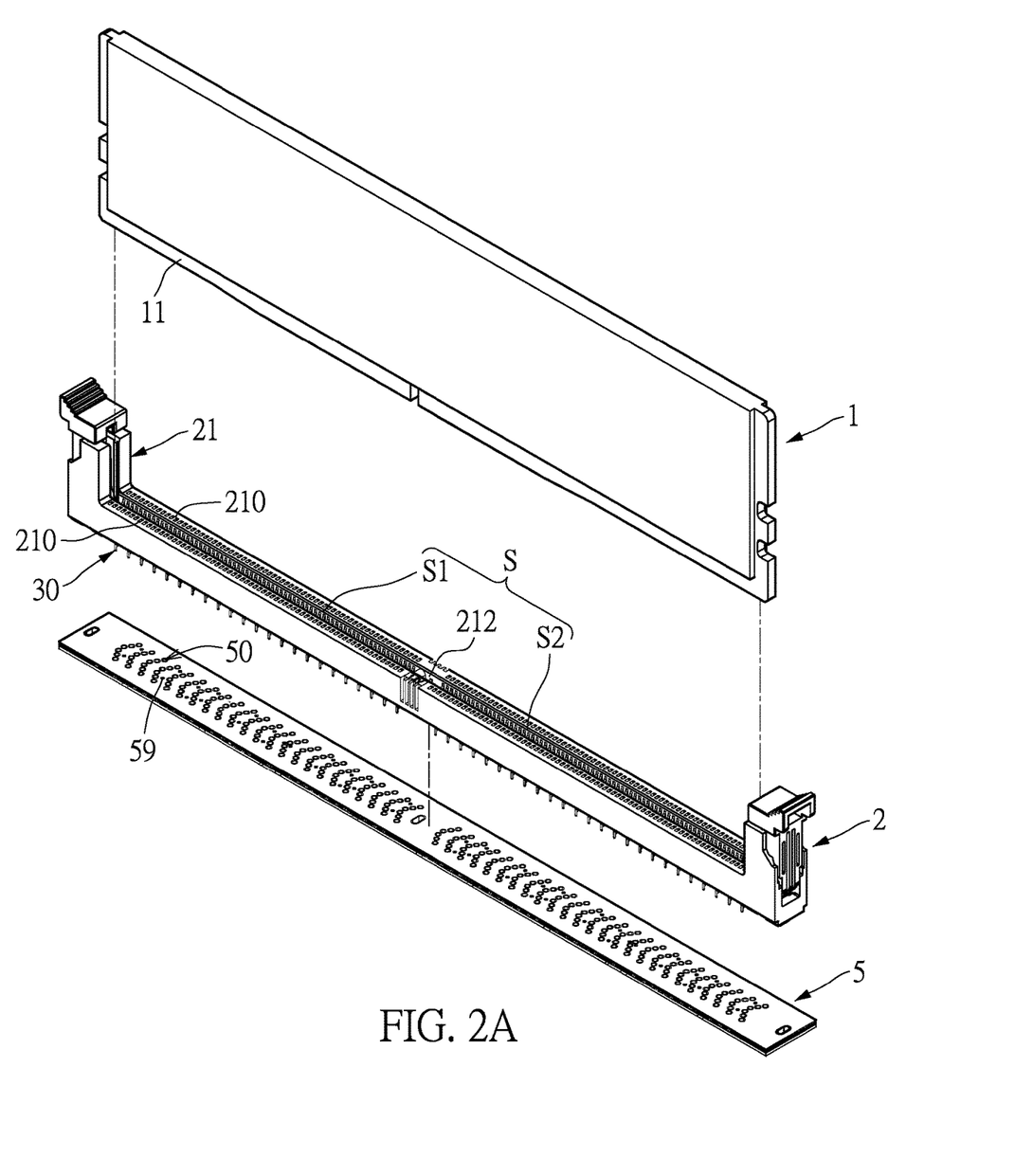
FIG. 2A is an exploded view of the card edge connector, the printed circuit board and the memory module card of the present disclosure.
Figure 2B:
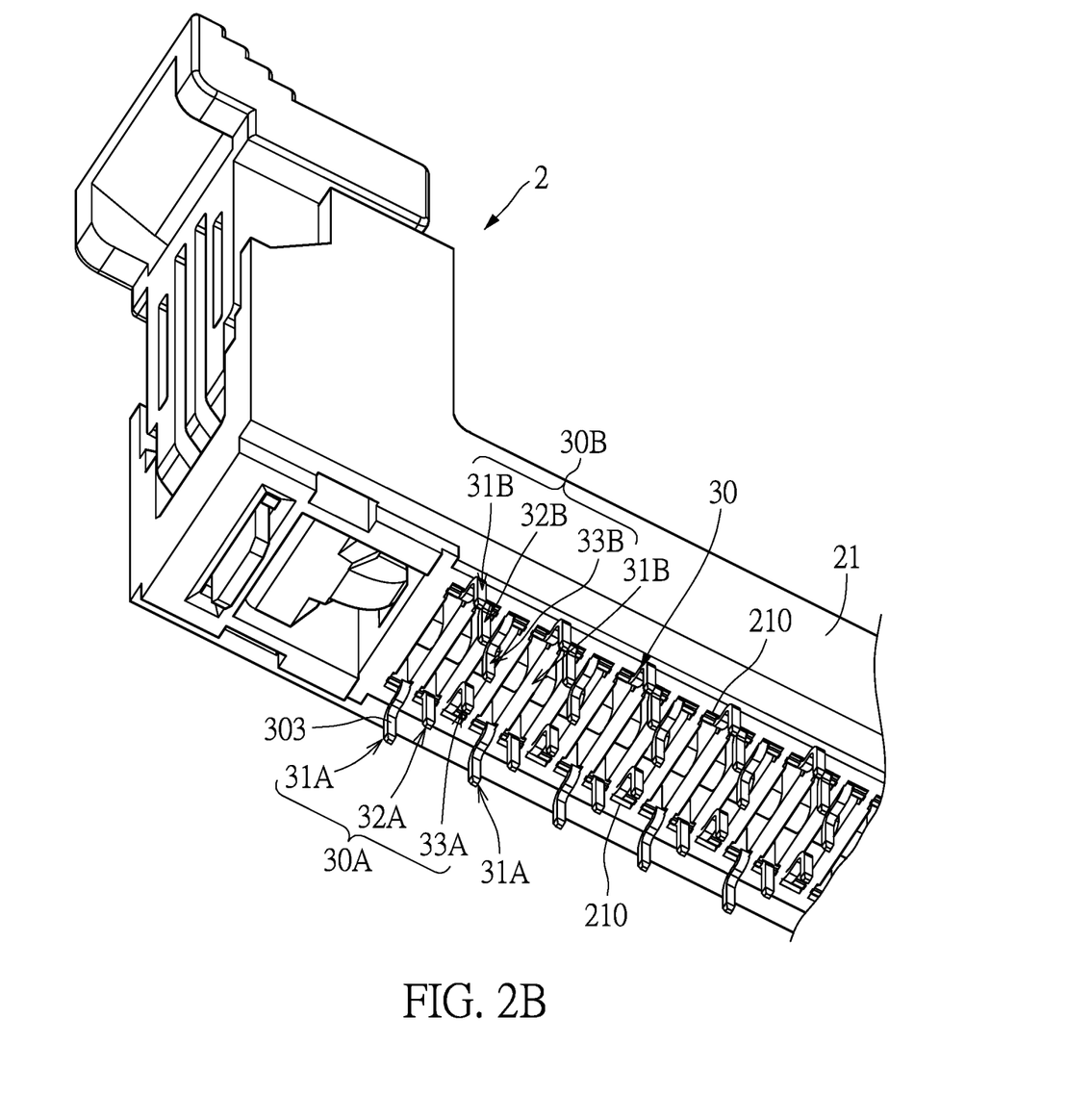
FIG. 2B is a partial perspective view of the card edge connector of the present disclosure.

Referring to FIG. 1 to FIG. 2B, the present disclosure provides an assembly of a printed circuit board and a card edge connector for a memory module card, which includes a memory module card 1 for plugging in a card edge connector 2 and a printed circuit board 5 for the card edge connector 2 mounted thereon. The card edge connector 2 of the present disclosure includes an insulated housing 21 and a plurality of terminals 30. The insulated housing 21 has an elongated slot S along a longitudinal direction thereof and a key portion 212. The key portion 212 is located in the elongated slot S and divides the elongated slot S into a first slot S1 and a second slot S2. The insulated housing 21 is formed with a plurality of terminal slots 210. The terminal slots 210 are located at two sides of the elongated slot S and perpendicular to the longitudinal direction.

Reference is made to FIG. 2B. The terminals 30 are respectively received in the terminal slot 210, and are divided into an upper group and a lower group. The upper group includes a plurality of upper terminal rows 30A and a plurality of lower terminal rows 30B. The upper terminal rows 30A are received in the terminal slots 210 arranged at one side of the longitudinal direction, that is, the upper side as shown in FIG. 2A. The lower terminal rows 30B are received in the terminal slots 210 arranged at the other side of the longitudinal direction, that is, the lower side as shown in FIG. 2A. Each of the upper terminal rows 30A and the lower terminal rows 30B include a first terminal 31A, 31B, a second terminal 32A, 32B, and a third terminal 33A, 33B. As shown in FIG. 3A to FIG. 3D, each terminal 30 has a contacting portion 301, a soldering portion 303 and a linking portion 302. The linking portion 302 interconnects the contacting portion 301 and the soldering portion 303.

Reference is made to FIG. 2A and FIG. 2B. When the memory module card 1 is inserted into the card edge connector 2, the contacting portion 301 electrically connects the golden fingers 11 of the memory module card 1. When the card edge connector 2 is mounted on the printed circuit board 5, the soldering portions 303 are inserted correspondingly into the plated through holes 50 formed on the printed circuit board 5.

As shown in FIG. 3A to FIG. 3D, the configuration of the upper terminal row 30A and the lower terminal row 30B according to this embodiment is introduced as follows. The linking portions 302 of the first terminals 31A, 31B are bent toward a direction away from the elongated slot S and perpendicular to the longitudinal direction. The bend direction of the linking portions 302 of the third terminals 33A, 33B are opposite to the bend direction of the linking portion 302 of the first terminal 31A, 31B. A bend radius of the linking portion 302 of the second terminal 32A (or 32B) is smaller than a bend radius of the first terminal 31A (or 31B), and is smaller than a bend radius of the third terminal 33A (or 33B). The linking portion 302 of the second terminal 32A (or 32B) is configured to be located closely between the linking portion 302 of the first terminal 31A (or 31B) and the linking portion 302 of the third terminal 33A (or 33B). A distance between the contacting portion 301 of the first terminal 31A (or 31B) and the contacting portion 301 of the second terminal 32A (or 32B) is equal to a distance D1 between the contacting portion 301 of the second terminal 32A (or 32B) and the contacting portion 301 of the third terminal 33A (or 33B). The distance D1 is larger than a distance D3 between the soldering portion 303 of the first terminal 31A (or 31B) and the soldering portion 303 of the second terminal 32A (or 32B), and also larger than a distance D3 between the soldering portion 303 of the second terminal 32A (or 32B) and the soldering portion 303 of the third terminal 33A (or 33B).

Figure 4A:
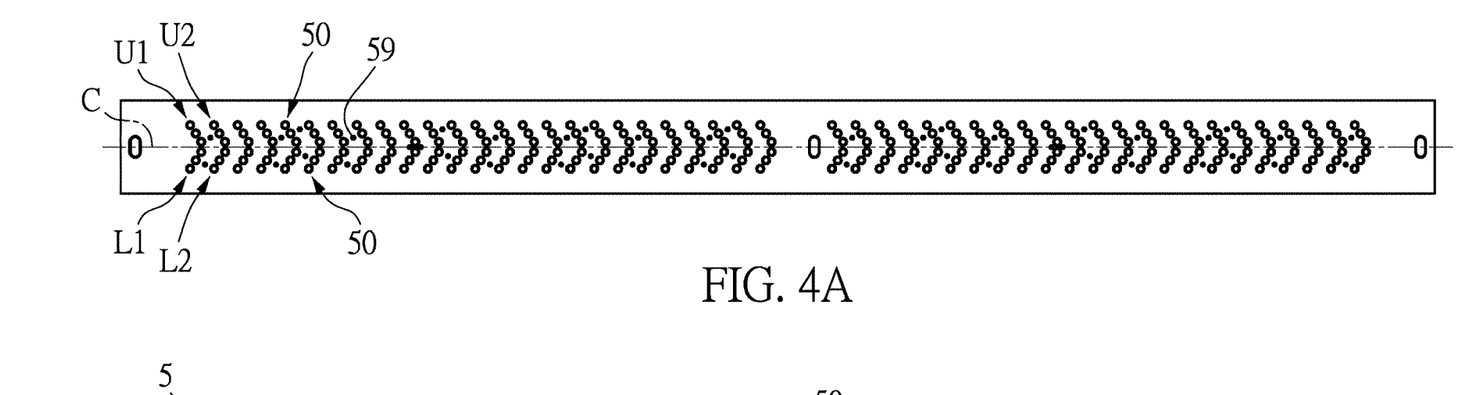
FIG. 4A is a top view of the printed circuit board of the present disclosure.

When the memory module card 1 is inserted in the card edge connector 2, the golden fingers 11 of the memory module card 1 electrically connect with the terminals 30. When the card edge connector 2 is mounted on the printed circuit board 5, the soldering portions 303 are inserted into the corresponding plated through holes 50 of the printed circuit board 5. In detail, as shown in FIG. 4D, the first terminal 31A of the upper terminal row 30A is disposed in the terminal slot 210 (as shown in FIG. 2D) at one side of the longitudinal direction of the insulated housing 21. The first terminal 31B of the lower terminal row 30B is configured to structurally mirror the first terminal 31A, and is disposed in the terminal slot 210 (as shown in FIG. 2D) at the other side of the longitudinal direction of the insulated housing 21.

The third terminal 33A of the upper terminal row 30A is configured to structurally mirror of the third terminal 33B of the lower terminal row 30B. In other words, the shape of the third terminal 33A of the upper terminal row 30A is configured to structurally mirror the shape of the third terminal 33B of the lower terminal row 30B, but both are arranged opposite to each other.

Figure 3A:
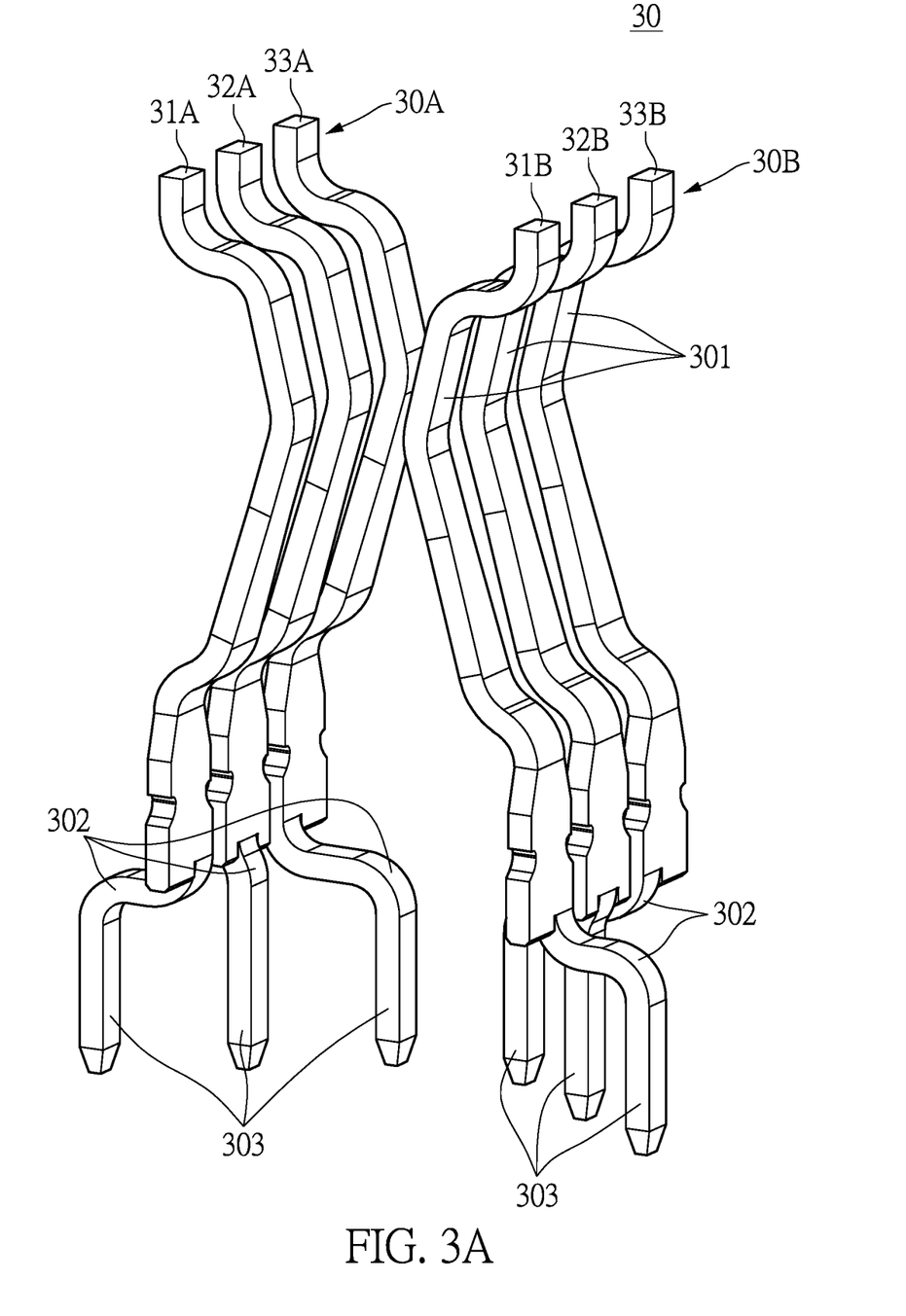
FIG. 3A is a perspective view of an upper and a lower terminal rows of the present disclosure.
Figure 3B:
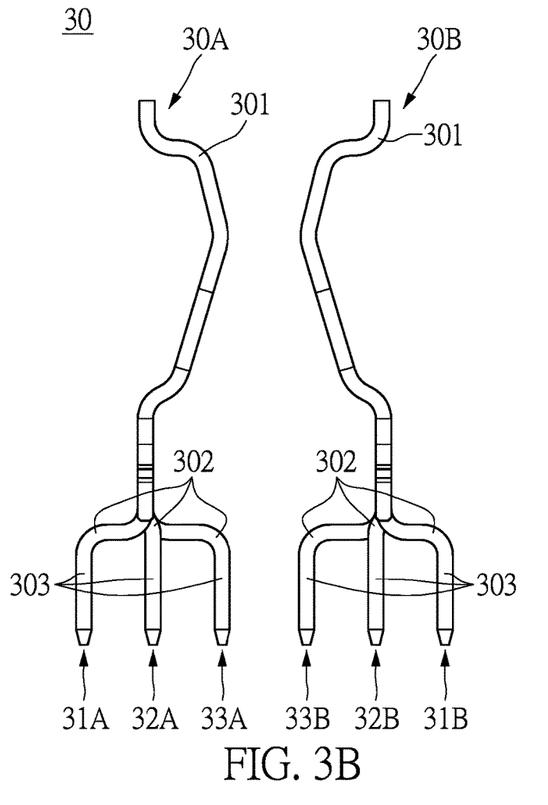
FIG. 3B is a side view of the upper and lower terminal rows of the present disclosure.
Figure 3C:
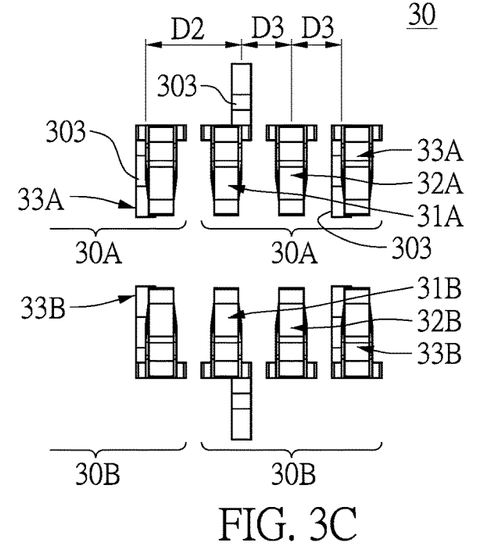
FIG. 3C is a top view of the upper and lower terminal rows of the present disclosure.
Figure 3D:
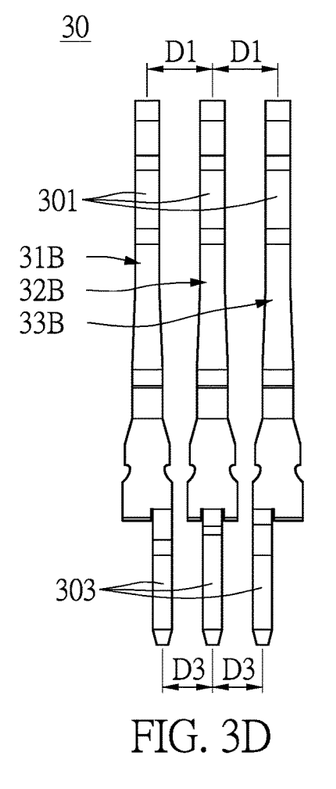
FIG. 3D is a front view of the upper and lower terminal rows of the present disclosure.

Reference is made to FIG. 3C. For each of the upper terminal rows 30A and the lower terminal rows 30B, a distance D2, between the soldering portion 303 of the first terminal (31A, 31B) and the soldering portion 303 of the third terminal (33A, 33B) that is adjacent to the other one of the terminal rows is larger than a distance D3 between the soldering portions 303 of the terminals 30 in the same terminal row as shown in FIG. 3D. In other words, the soldering portions 303 of the terminals 30 in the same terminal row are close to each other toward the second terminal (32A or 32B), such as the lower terminal row 30B shown in FIG. 3D. When the second terminals (32A or 32B) are used to process ground signals, a good shielding effect thus can be provided for transmission of high-frequency signals Reference is made to FIG. 4A and FIG. 4B. The printed circuit board 5 includes a plurality of plated through holes 50 and a plurality of grounding via holes 59. The plated through holes 50 of this embodiment are correspondingly matched with the terminals 30 of the card edge connector, and are soldered for electrical connection. However, the present disclosure is not limited thereto. For example, the terminals can be press-contact terminals, in which the bottom end of the terminal is pressed and contacted to corresponding pads on the printed circuit board 5. The grounding via holes 59 are not electrically conducted with the terminals of the card edge connector, which are electrically connected by ground traces of the stacking structure of the printed circuit board 5. The plated through holes 50 are respectively located at two sides of an orthographic projection C of the elongated slot S of the card edge connector 2, that can be taken as the central line C of the printed circuit board 5, as shown in FIG. 4C. The plated through holes 50 in one of the sides are arranged into a plurality of upper rows (U1, U2, etc.) parallel to each other and oblique to the longitudinal direction of the printed circuit board 5. The plated through holes 50 in the other side are arranged into a plurality of lower rows (L1, L2, etc.) parallel to each other and oblique to the longitudinal direction of the printed circuit board 5. Included angles between the upper rows (U1, U2, . . . ) and the lower rows (L1, L2, etc.) are obtuse. The plated through holes 50 of each upper row correspond to one of the upper terminal rows 30A. The plated through holes 50 of each lower row correspond to one of the lower terminal rows 30B. The plated through holes 50 include a plurality of high-frequency signal holes 50s and a plurality of ground signal holes 50g. For ease of distinction, the high-frequency signal holes 50s are illustrated with dots on a periphery thereof, and peripheries of the ground signal holes 50g remain blank. Not all of the plated through holes are labeled, and subsequent descriptions should be considered as being accordingly configured.

Figure 4B:
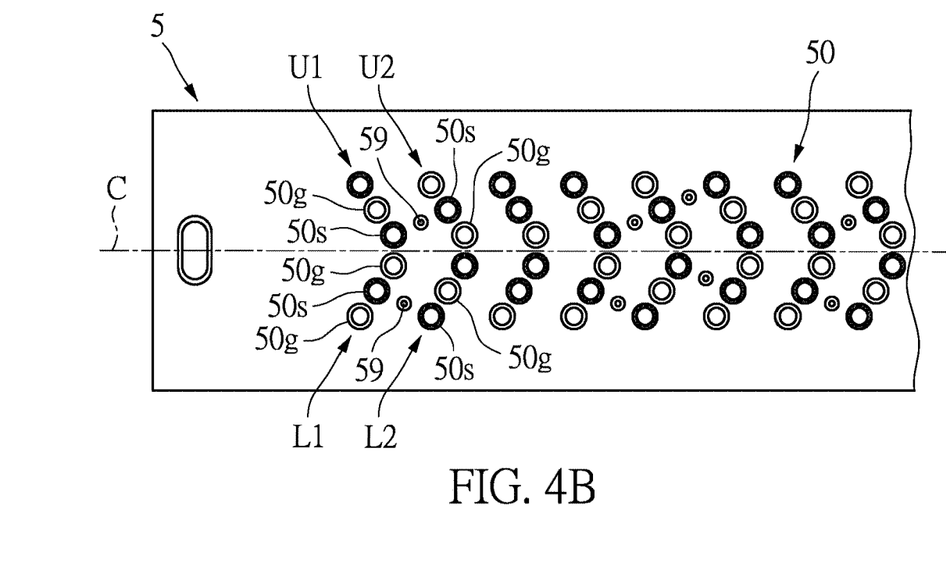
FIG. 4B is a partially enlarged top view of the printed circuit board of the present disclosure.
Figure 4C:
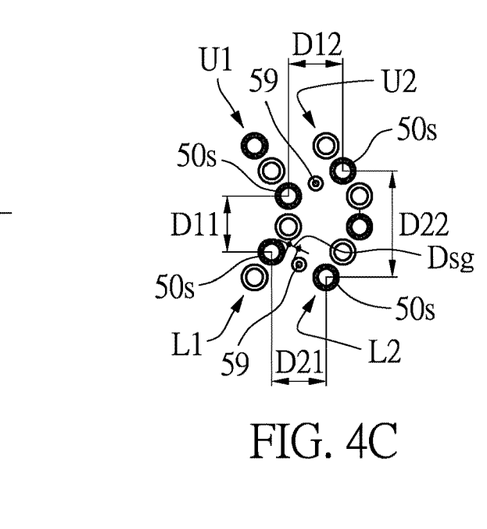
FIG. 4C is a partially enlarged top view of plated through holes of the printed circuit board of the present disclosure.
Figure 4D:
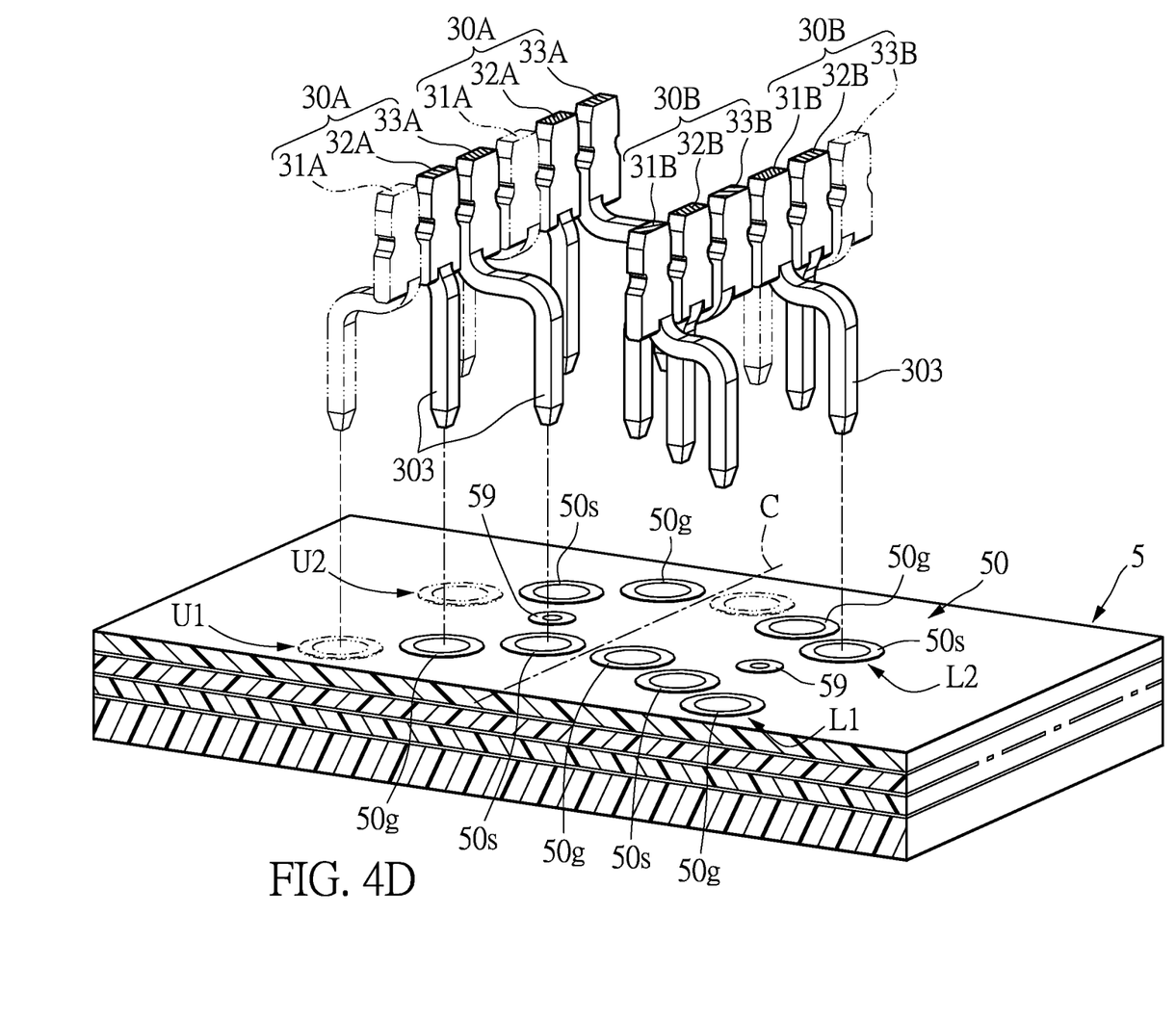
FIG. 4D is a perspective view of the upper and lower terminal rows and a part of the printed circuit board of the present disclosure.

Reference is made to FIG. 4B and FIG. 4D. The matching relationship of the plated through holes 50 of the upper rows and the terminals is introduced as follows. The ground signal hole 50g of the first upper row U1 is matched with the second terminal 32A of the upper terminal row 30A. The high-frequency signal hole 50s of the first upper row U1, which is adjacent to the ground signal hole 50g of the first upper row U1, is matched with the third terminal 33A of the upper terminal row 30A. The high-frequency signal hole 50s of the second upper row U2 is matched with the second terminal 32A of the upper terminal row 30A. The ground signal hole 50g of the second upper row U2, which is adjacent to the high-frequency signal hole 50g of the second upper row U2, is matched with the third terminal 33A of the upper terminal row 30A.

The matching relationship of the plated through holes 50 of the lower rows L1, L2 and the terminals is introduced as follows. The ground signal hole 50g of the first lower row L1 is matched with the first terminal 31B of the lower terminal row 30B. The high-frequency signal hole 50s of the first lower row L1, which is adjacent to the ground signal hole 50g of first lower row L1, is matched with the second terminal 32B of the lower terminal row 30B. The ground signal hole 50g of the first lower row L1, which is adjacent of the high-frequency signal hole 50s of the first lower row L1, is matched with the third terminal 33B of the lower terminal row 30B. The high-frequency signal hole 50s of the second lower row L2 is matched with the first terminal 31B of the lower terminal row 30B. The ground signal hole 50g of the second lower row L2, which is adjacent to the high-frequency signal hole 50s of the second lower row L2, is matched with the second terminal 32B of the lower terminal row 30B.

Another feature of this embodiment is that the high-frequency signal hole 50s of the first upper row U1 and the high-frequency signal hole 50s of the second upper row U2 are separated by one of the grounding via holes 59. The high-frequency signal hole 50s of the first lower row L1 and the high-frequency signal hole 50s of the second lower row L2 are separated by one of the grounding via holes 59. In an exemplary embodiment, the high-frequency signal hole 50s of the first upper row U1, the high-frequency signal hole 50s of the second upper row U2, and the grounding via hole 59 positioned therebetween are arranged in a line. In an exemplary embodiment, the high-frequency signal hole 50s of the first lower row L1, the high-frequency signal hole 50s of the second lower row L2, and the grounding via hole 59 positioned therebetween are arranged in a line. By such configuration, the high-frequency signal hole 50s are separated by the grounding via holes 59, so as to provide a good shielding effect for avoiding cross-talk interference.

Reference is made to FIG. 4D. In addition, according to the arrangement of this embodiment, the outermost one of the plated through holes 50 of the first upper row U1, which is apart from the central line C, is not limited in the high-frequency signal hole 50s, and can be the ground signal hole 50g. The outermost one of the plated through hole 50 of the second upper row U2 is not limited in the ground signal hole 50g, and can be the high-frequency signal hole 50s. The innermost one of the plated through hole 50 of the second lower row L2, close to the central line C, is not limited in the high-frequency signal hole 50s, and can be the ground signal hole 50g.

Reference is made to FIG. 4C. According to an exemplary dimension of this embodiment described as follows, one can find that the dimension of this embodiment is reduced effectively. An orthogonal projected distance D12 of a pitch between the high-frequency signal hole 50s of the second upper row U2 and the high-frequency signal hole 50s of the first upper row U1 on the longitudinal direction is about 1.4 mm to 2.0 mm.

An orthogonal projected distance D21 of a pitch between the high-frequency signal hole 50s of the second lower row L2 and the high-frequency signal hole 50s of the first lower row L1 on the longitudinal direction is about 1.4 mm to 2.0 mm.

An edge clearance Dsg between the high-frequency signal hole 50s of the first lower row L1 and a contiguous one of the grounding via holes 59 is about 0.1 mm to 0.49 mm.

An orthogonal projected distance D22 of a pitch between the high-frequency signal hole 50s of the second upper row U2 and the outermost high-frequency signal hole 50s of the second lower row L2 on a direction perpendicular to the longitudinal direction is about 3.6 mm to 4.0 mm. The orthogonal projected distance D22 is larger than an orthogonal projected distance D11 of a pitch between the high-frequency signal hole 50s of the first upper row and the high-frequency signal hole 50s of the first lower row L1 on a direction perpendicular to the longitudinal direction.

Figure 5A:
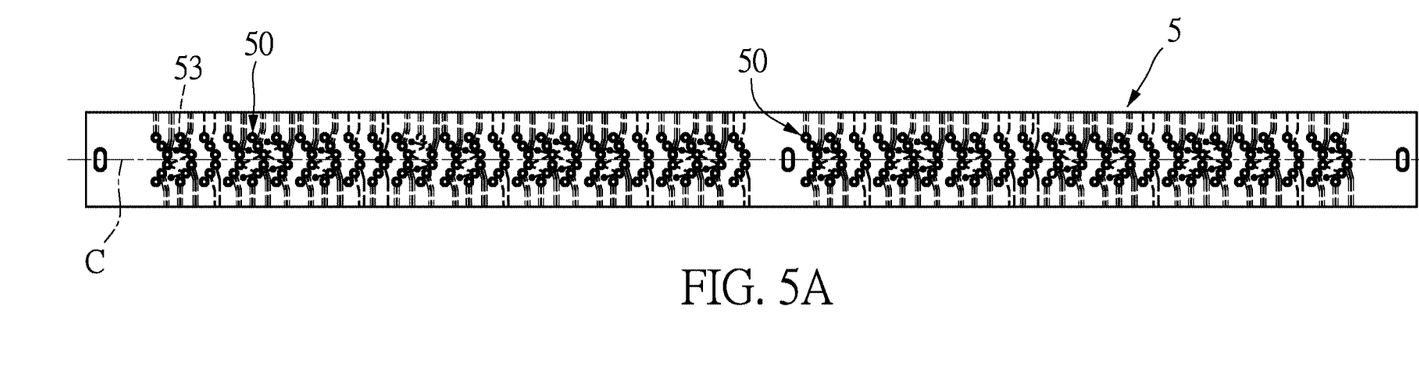
FIG. 5A is an overlay schematic view of the printed circuit board of the present disclosure.
Figure 5B:
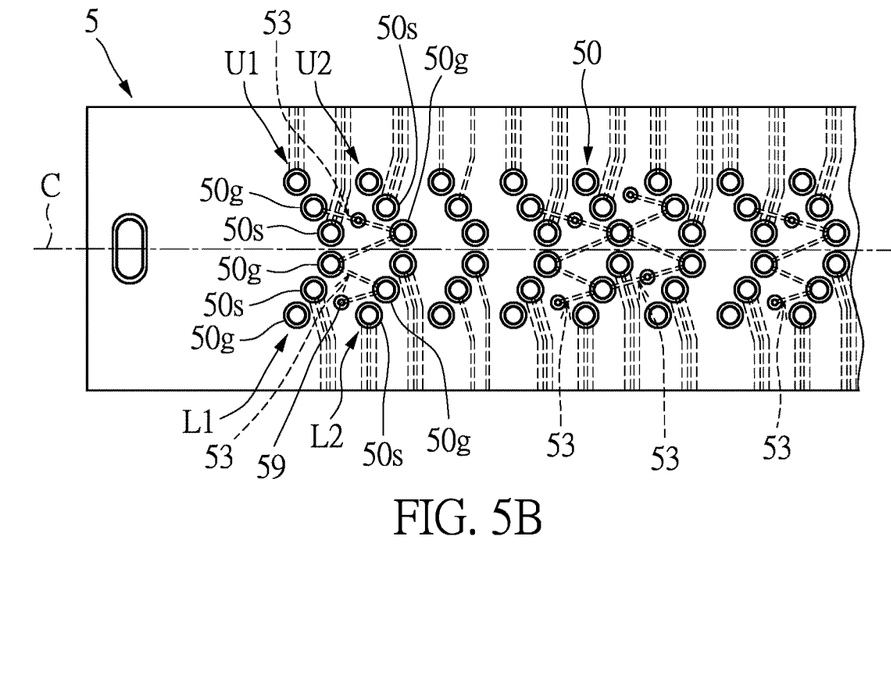
FIG. 5B is a partially enlarged overlay schematic view of the printed circuit board of the present disclosure.

Reference is made to FIG. 5A and FIG. 5B. As shown in FIG. 5B, the printed circuit board 5 has an internal serpentine trace 53 formed therein. The internal serpentine trace 53 is substantially N-shaped. The internal serpentine trace 53 has four endpoints, which respectively connect the ground signal holes 50g of two upper rows and two lower rows. In other words, the four endpoints respectively connect the ground signal holes 50g of the first upper row U1, the inner ground signal hole 50g of the second upper row U2, the inner ground signal hole 50g of the first lower row L1, the ground signal hole 50g of the second lower row L2. The internal serpentine trace 53 forms two included spaces, which respectively receive one of the high-frequency signal holes 50s, that are the inner high-frequency signal hole 50s of the first upper row U1, and the inner high-frequency signal hole 50s of the second lower row L2.

The internal serpentine trace 53 of this embodiment further extends to connect the grounding via hole 59 between the high-frequency signal hole 50s of the first lower row L1 and the outermost high-frequency signal hole 50s of the second lower row L2, such that the internal serpentine trace 59 is substantially W-shaped. By such configuration, all of the high-frequency signal holes 50s are divided from each other by the grounding internal serpentine trace 53, so as to provide good shielding for avoiding cross-talk interference. However, the internal serpentine trace formed in the printed circuit board 5 is merely one exemplary embodiment, and the present disclosure is not limited thereto.

Figure 6:
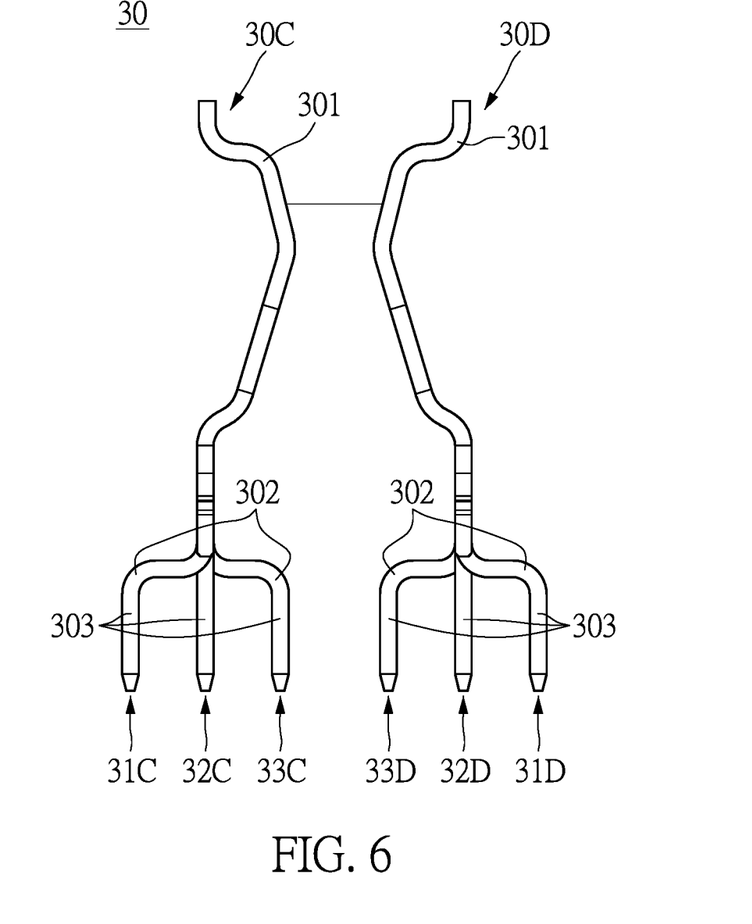
FIG. 6 is a side view of the upper and lower terminal rows according to a second embodiment of the present disclosure.

Reference is made to FIG. 6, which is a side view of another embodiment of the upper and lower terminal rows. The upper and lower terminal rows of the present disclosure are not limited to the above-mentioned embodiment. According to this exemplary embodiment, for the terminals 30 in the upper terminal row 30C and the lower terminal row 30D, the linking portions 302 of the second terminal 32C, 32D directly extend downward from the bottom end of the contacting portions 301 without bending, which are coplanar with the soldering portion 303. A bend radius of the linking portion 302 of the first terminal 31C, (or 31D) can be the same as a bend radius of the linking portion 302 of the second terminals 33C, (or 33D). For the upper terminal row 30C and the lower terminal row 30D in this embodiment, the pitch between the soldering portions 303 is the same as the pitch D3 of the above embodiment. According to the side view of FIG. 6, in this embodiment, the pitch between the soldering portions 303 is the same as the pitch of the soldering portions 303 as shown in FIG. 3B.

Figure 7:
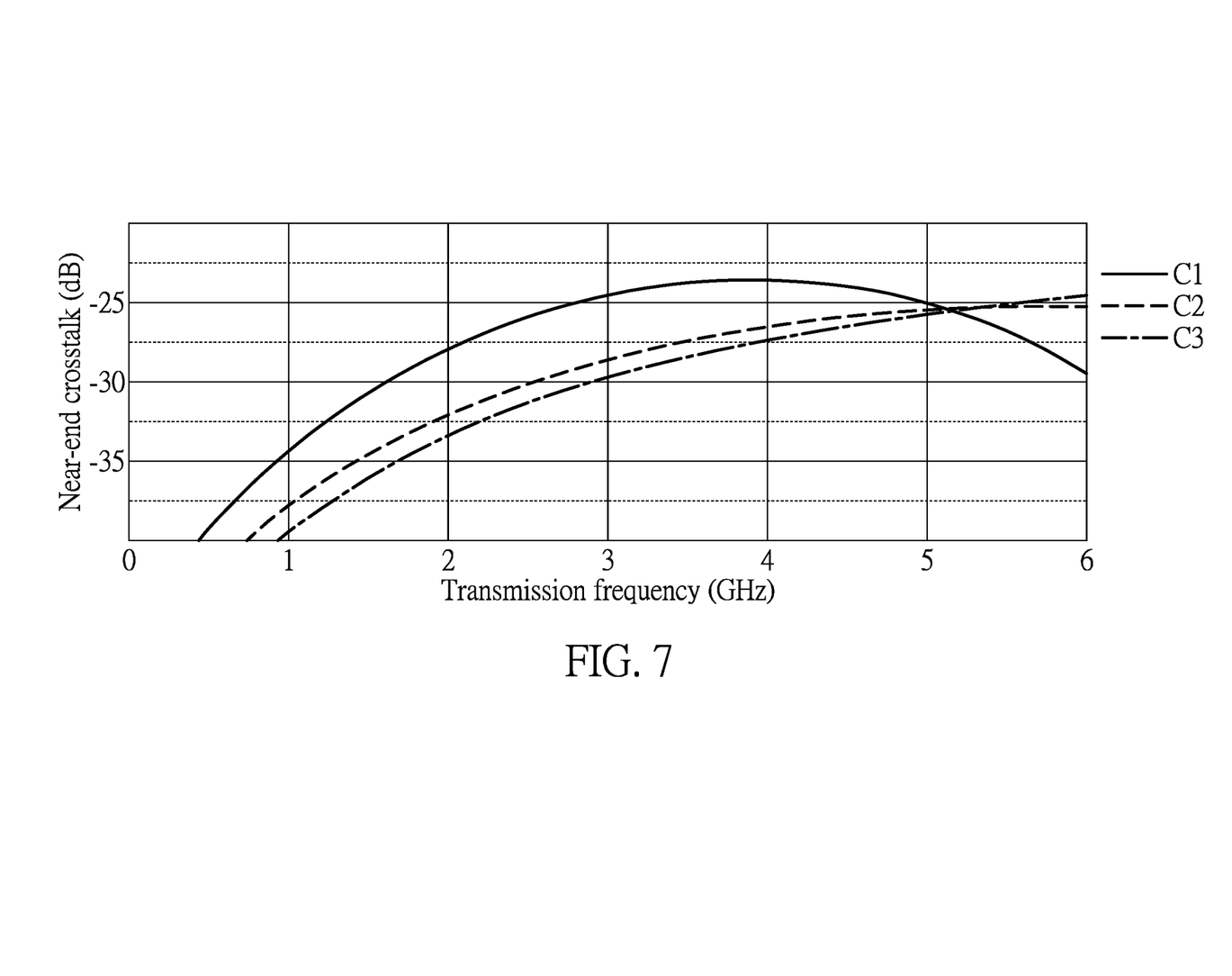
FIG. 7 is a curve diagram of a transmission frequency of the terminals and near-end crosstalk noises according to the present disclosure.

Reference is made to FIG. 7, which is a curve diagram of a transmission frequency of the terminals and near-end crosstalk noises of the present disclosure. The horizontal axis (X-axis) in FIG. 7 indicates transmission frequency with a unit of GHz, and the vertical axis (Y-axis) indicates near end crosstalk with a unit of decibels (dB). Under a condition of a transmission frequency of under 5 GHz, the three curves from top to bottom up to down respectively represent transmission performance curves C1, C2, and C3. The curve C1 is a curve of a traditional DIMM (dual in-line packaged memory module) card inserted in the card edge connector. The curve C2 is a curve of the memory module card and the card edge connector with plug-in terminals according to the present disclosure. The curve C3 is a curve of the card edge connector with SMT (surface mounted technology) terminals according to the present disclosure.

According to curve C2, it can be observed that the present disclosure has advantages as follows. The near end crosstalk of high-frequency signals is lower than −25 dB under a transmission frequency within a range of 0 GHz to 5 GHz, and the single channel transmission bandwidth can achieve a breakthrough of 51.2 GB/s, so as to provide a better shielding effect for high-frequency signal transmissions and enhance the capacity of channel transmission.

In conclusion, the present disclosure has advantages and functions as follows. In the card edge connector of the present disclosure, in the same terminal row, since the soldering portions of the terminals extend toward the second terminal and are close to each other, a better shielding effect for the high-frequency signal transmission can be provided when the second terminal is used to transmit ground signals. The high-frequency signal holes 50s are isolated by ground traces or the grounding via holes, such that they can provide a good shielding effect for avoiding cross-talk interference. The printed circuit board, on which the card edge connector is mounted, is also configured correspondingly, so as to provide a DIMM (dual in-line packaged memory module) connector being able to be mass produced, with a performance capable of matching with the DDR memory module card of the next generation.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An assembly of a printed circuit board and a card edge connector for a memory module card, comprising a card edge connector, and a printed circuit board,
  wherein the card edge connector includes:
    an insulated housing having an elongated slot formed along a longitudinal direction thereof and a key portion, the key portion located in the elongated slot so as to divide the elongated slot into a first slot and a second slot, the insulated housing formed with a plurality of terminal slots; the terminal slots are respectively located at two sides of the elongated slot and perpendicular to the longitudinal direction; and
    a plurality of terminals respectively received in the terminal slots, wherein the terminals are divided into a plurality of upper terminal rows and a plurality of lower terminal rows, the upper terminal rows are received in the terminal slots arranged at one side of the longitudinal direction, the lower terminal rows are received in the terminal slots arranged at the other side of the longitudinal direction; the upper terminal row and the lower terminal row respectively include a first terminal, a second terminal, and a third terminal, each of the terminals has a contacting portion, a soldering portion and a linking portion, and the linking portion interconnects the contacting portion and the soldering portion;
  wherein in the upper terminal row and the lower terminal row, the linking portion of the first terminal is bent toward a direction perpendicular to the longitudinal direction away from the elongated slot, a bending direction of the linking portion of the third terminal is opposite to a bending direction of the first terminal, the linking portion of the second terminal is configured to be located closely between the linking portion of the first terminal and the linking portion of the third terminal; a distance between the contacting portion of the first terminal and the contacting portion of the second terminal is equal to a distance between the contacting portion of the second terminal and the contacting portion of the third terminal, and said distance is larger than a distance between the soldering portion of the first terminal and the soldering portion of the second terminal, and is larger than a distance between the soldering portion of the second terminal and the soldering portion of the third terminal;
  wherein the first terminal of the upper terminal row is disposed in the terminal slot at one side of the longitudinal direction of the insulated housing, and is configured to structurally mirror the first terminal of the lower terminal row disposed in the terminal slot at the other side of the longitudinal direction of the insulated housing; the third terminal of the upper terminal row is configured to structurally mirror the third terminal of the lower terminal row; wherein in the upper terminal row and the lower terminal row, a distance between the soldering portion of the first terminal and the soldering portion of the third terminal in contiguous one terminal group is larger than a distance between the soldering portions of the terminals in the same terminal group;

wherein the printed circuit board is formed with a plurality of plated through holes and a plurality of grounding via holes, the plated through holes are respectively located at two sides of an orthographic projection of the elongated slot of the card edge connector, the plated through holes are arranged into a plurality of upper rows on one of the sides and a plurality of lower rows on the other side oblique to the longitudinal direction of the printed circuit board;

wherein the plated through holes include a plurality of ground signal holes and a plurality of high-frequency signal holes, and are configured as follows:

the ground signal hole of a first upper row being correspondingly matched with the second terminal of the upper terminal row, the high-frequency signal hole of the first upper row close to the ground signal hole of the first upper row being correspondingly matched with the third terminal of the upper terminal row, the high-frequency signal hole of a second upper row being correspondingly matched with the second terminal of the upper terminal row, the ground signal hole of the second upper row being correspondingly matched with the third terminal of the upper terminal row, and being close to the high-frequency signal hole of the second upper row;

the ground signal hole of a first lower row being correspondingly matched with the first terminal of the lower terminal row, the high-frequency signal hole of a first lower row close to the ground signal hole of the first lower row being correspondingly matched with the second terminal of the lower terminal row, the ground signal hole of the first lower row close to the high-frequency signal hole of the first lower row being correspondingly matched with the third terminal of the lower terminal row, the high-frequency signal hole of a second lower row being correspondingly matched with the first terminal of the lower terminal row, the ground signal hole of the second lower row close to the high-frequency signal hole of the second lower row being correspondingly matched with the second terminal of the lower terminal row; and wherein the high-frequency signal hole of the first upper row and the second upper row of the high-frequency signal hole are separated by one of the grounding via holes, and the high-frequency signal hole of the first lower row and the high-frequency signal hole of the second lower row are separated by one of the grounding via holes.

2. The assembly of the printed circuit board and the card edge connector according to claim 1, wherein a distance between the high-frequency signal hole of the second upper row along the longitudinal direction and the high-frequency signal hole of the first upper row is about 1.4 mm to 2.0 mm; wherein a distance between the high-frequency signal hole of the second lower row along the longitudinal direction and the high-frequency signal of the hole first lower row is 1.4 mm to 2.0 mm.

3. The assembly of the printed circuit board and the card edge connector according to claim 1, wherein a distance between the high-frequency signal hole of the first lower row and adjacent one of the grounding via holes is about 0.1 mm to 0.49 mm.

4. The assembly of the printed circuit board and the card edge connector according to claim 1, wherein an orthogonal projected distance of a pitch between the high-frequency signal hole of the second upper row of the plated through holes and the high-frequency signal hole of the second lower row on a direction perpendicular to the longitudinal direction is about 3.6 mm to 4.0 mm, and is larger than an orthogonal projected distance of a pitch between the high-frequency signal hole of the first upper row and the high-frequency signal hole of the first lower row on a direction perpendicular to the longitudinal direction.

5. The assembly of the printed circuit board and the card edge connector according to claim 1, wherein the printed circuit board has an internal serpentine trace formed therein, the internal serpentine trace is substantially N-shaped, and the internal serpentine trace has endpoints respectively connect to the ground signal holes of two upper rows and two lower rows.

6. The assembly of the printed circuit board and the card edge connector according to claim 5, wherein the internal serpentine trace forms two included spaces respectively receiving one of the high-frequency signal holes.

7. The assembly of the printed circuit board and the card edge connector according to claim 5, wherein the internal serpentine trace further extends to connect the grounding via hole between the high-frequency signal hole of the first lower row and the outermost high-frequency signal hole of the second lower row, such that the internal serpentine trace is substantially W-shaped.

8. The assembly of the printed circuit board and the card edge connector according to claim 1, wherein the plated through holes of the upper rows are parallel to each other, the plated through holes of the lower rows are parallel to each other, and a plurality of included angles between the plated through holes of the upper rows and the plated through holes of the lower rows are obtuse.

9. The assembly of the printed circuit board and the card edge connector according to claim 1, wherein a bend radius of the linking portion of the second terminal is smaller than a bend radius of the linking portion of the first terminal, and is smaller than a bend radius of the linking portion of the third terminal.

10. The assembly of the printed circuit board and the card edge connector according to claim 1, wherein the linking portion of the second terminal directly extends downward from a bottom end of the contacting portion without bending, and is coplanar with the soldering portion.

11. The assembly of the printed circuit board and the card edge connector according to claim 1, wherein in the same one of the terminal groups, a pitch of any adjacent two of the soldering portions of the terminals for transmitting high-frequency signal is larger than a pitch between the soldering portion of the terminal for transmitting high-frequency signal and the soldering portion of the terminal for grounding, such that a near end cross-talk of high-frequency signals is lower than −25 dB under a transmission frequency within a range of 0 GHz to 5 GHz, and the single channel transmission bandwidth reaches 51.2 GB/s.

* * * * *